United States Patent [19]

Kanbe et al.

[11] Patent Number: 5,489,803
[45] Date of Patent: Feb. 6, 1996

[54] SOLDER-BONDED STRUCTURE

[75] Inventors: Masakata Kanbe, Komaki; Hitoshi Iwata, Hashima; Kenichi Kinoshita, Kuwana, all of Japan

[73] Assignee: Kabushiki Kaisha Tokai Rika Denki Seisakusho, Aichi, Japan

[21] Appl. No.: 210,605

[22] Filed: Mar. 18, 1994

Related U.S. Application Data

[63] Continuation of Ser. No. 852,311, Mar. 19, 1992, abandoned.

[30] Foreign Application Priority Data

Mar. 22, 1991 [JP] Japan ......................... 3-59094
May 14, 1991 [JP] Japan ......................... 3-109410

[51] Int. Cl.$^6$ ..................... H01L 23/48; H01L 29/44; H01L 29/52; H01L 29/12
[52] U.S. Cl. ............ 257/767; 257/734; 257/741; 257/748; 257/762; 257/768
[58] Field of Search .................. 257/734, 736, 257/741, 748, 762, 767, 768

[56] References Cited

U.S. PATENT DOCUMENTS 4,124,455  11/1978  Lindmayer ................ 257/768
4,266,090   5/1981  Scherer ..................... 174/52
4,480,261  10/1984  Hattori et al. ............. 257/762

OTHER PUBLICATIONS

Thesis for the 4th Microelectronics Symposium in Tokyo, Japan, "High Reliability of Solder Joint on Hybrid Circuit" by Masakata Kanbe, Hitoshi Iwata, Katsuya Kogiso, Shouichi Ohya.

"The Role of Thin Film Materials on the Technology of Integrated Circuit Fabrication" Federico Sequeda, Journal of Metals Nov. 1985.

Primary Examiner—Sara W. Crane
Assistant Examiner—Carl Whitehead, Jr.
Attorney, Agent, or Firm—Stetina Brunda & Buyan

[57] ABSTRACT

An improved solder-bonding structure is disclosed that is particularly suitable for soldering the components of hybrid ICs. The solder-bonding structure includes a conductor formed on a substrate. The conductor is formed from silver and platinum. A solder layer formed from a tin and silver solder is then formed on the conductor to couple an electronic element to the conductor. In preferred aspects of the invention, the platinum content in the conductor is in the range of approximately 0.7 to 1.0% by weight. The silver content in the solder layer is in the range of approximately 0.1 to 5.0% by weight.

4 Claims, 6 Drawing Sheets

SOLDER-BONDED STRUCTURE

This application is a continuation of application Ser. No. 07/852,311, filed Mar. 19, 1992 now abandoned.

BACKGROUND OF THE INVENTION

This application claims the priority of Japanese Patent Application No. 3-109410 filed on May 14, 1991 and No. 3-59094 filed on Mar. 22, 1991 which are incorporated herein by references.

1. Field of the Invention

The present invention relates to a solder-bonded structure which is formed on a substrate.

2. Description of the Related Art

The ability for hybrid ICs (integrated circuit) to withstand extreme environmental conditions has recently been demanded. In particular, hybrid ICs for vehicles are required to have excellent durability when exposed to various temperatures. Especially, the durability of the hybrid ICs when they are repeatedly exposed to low temperature and high temperature, i.e., the durability to a so-called heat cycle is considered most important.

Figure 11:
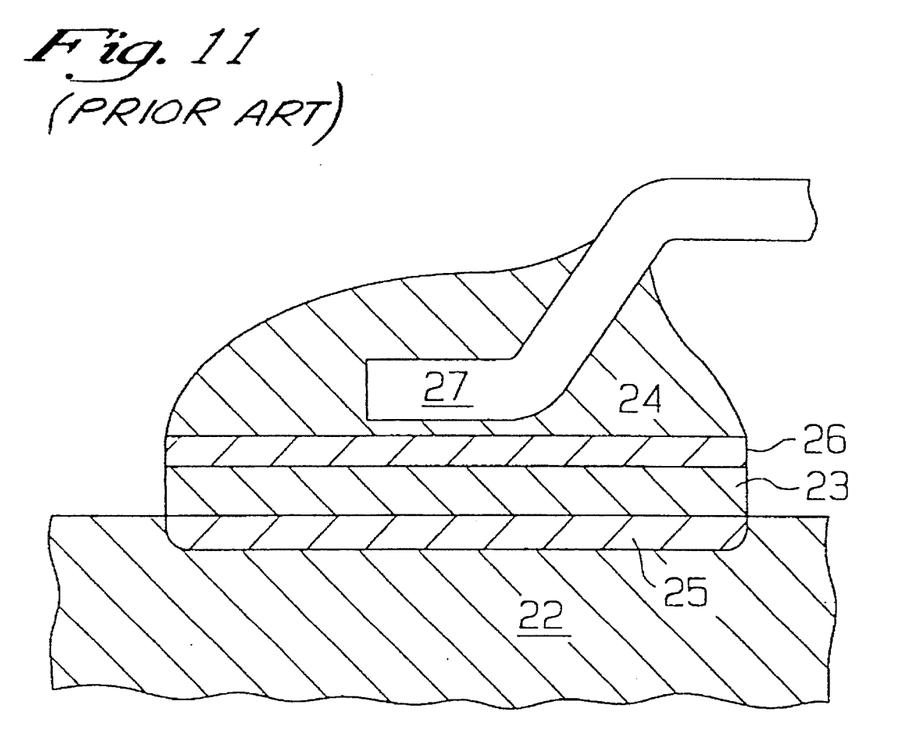
FIG. 11 is an exemplary fragmentary cross section of an IC for explaining a conventional solder-bonded structure.

Generally, conventional hybrid ICs for vehicles or the like are fabricated as follows. As shown in FIG. 11, a patterned screen mask (not shown) is attached on a hybrid IC substrate 22 of alumina (hereafter simply referred to as "substrate"). Screen printing is then performed on the substrate 22. A conductor paste is coated on the substrate 22 in the form of a circuit pattern. The pasted substrate is then sintered, thereby forming a conductor 23 on the substrate 22. The elements of the conductor 23 are included in the paste.

The conductor 23 is generally made of silver alone or in combination with platinum [Ag/Pt=99.0 to 99.3/1.0 to 0.7 (weight ratio)]. When the conductor 23 is formed through the sintering process, a connection layer 25 shown in FIG. 11 is formed between the substrate 22 and the conductor 23. The connection layer 25 mainly consists of composite aluminum oxide, which has bismuth and copper in the paste incorporated therein.

Soldering cream is coated at a predetermined position on the conductor 23, and electronic parts 27 are arranged on the soldering cream. Then, a so-called reflow process is carried out for the substrate 22 provided with the electronic parts 27. In the reflow process, the soldering cream is melted and then cooled and solidified, providing a solder layer 24. At this time, the solder layer 24 is bonded with the electronic parts 27.

The solder layer 24 generally contains silver, tin and lead [Ag/Sn/Pb=2/62/36 (weight ratio)]. During the reflow process, a silver-tin alloy layer (intermetallic compound) 26 is formed between the conductor 23 and the solder layer 24. It assumes that silver contained in the conductor 23 and tin in the solder layer 24 are mutually diffused to provide the intermetallic compound 26.

Heat cycle tests conducted on the above-described hybrid IC showed that the greater the number of heat cycles is, the more significant the reduction in peel strength of the electronic parts 27 from the substrate 22 becomes. When the electronic parts 27 were detached from the substrate 22 after such cycling, it was observed that peeling had occurred between the substrate 22 and the connection layer 25 in most cases.

SUMMARY OF THE INVENTION

The present invention has been proposed with a view to solving the above problems, and it is therefore an object of the present invention to provide a solder-bonded structure with strong bonding power which has good durability against repeated heat cycles.

To achieve the object, an improved solder-bonded structure is disclosed. The structure includes a conductor formed on a substrate. The conductor is formed from silver and platinum. A solder layer formed from a tin and silver solder is then formed on the conductor to couple an electronic element to the conductor.

In preferred aspects of the invention, the invention is applied to hybrid ICs. The preferred silver content in the solder layer is in the range of approximately 0.1 to 5.0% by weight.

In a method aspect of the invention, a method of fabricating a hybrid IC is disclosed. In the method aspect, a patterned screen mask is provided on a substrate. A silver and platinum paste is then coated on the masked substrate to form a circuit pattern. The coated substrate is sintering to form a conductor layer on the substrate, there being a connection layer formed between the substrate and the conductor layer during the sintering step. A tin and silver soldering cream is then coated on the sintered conductor layer. An electronic part is placed on the soldering cream and the resultant structure is soldered to form a solder layer that attaches the electronic part to the conductor layer.

BRIEF DESCRIPTION OF THE DRAWINGS

The invention, together with the objects and advantages thereof, may best be understood by reference to the following description of the presently preferred embodiment in conjunction with the accompanying drawings in which.

DETAILED DESCRIPTION OF THE PREFERRED EMBODIMENT

A preferred embodiment of the present invention embodied in a hybrid IC for a vehicle will now be described in comparison with various comparative examples, referring to the accompanying drawings.

Figure 1:
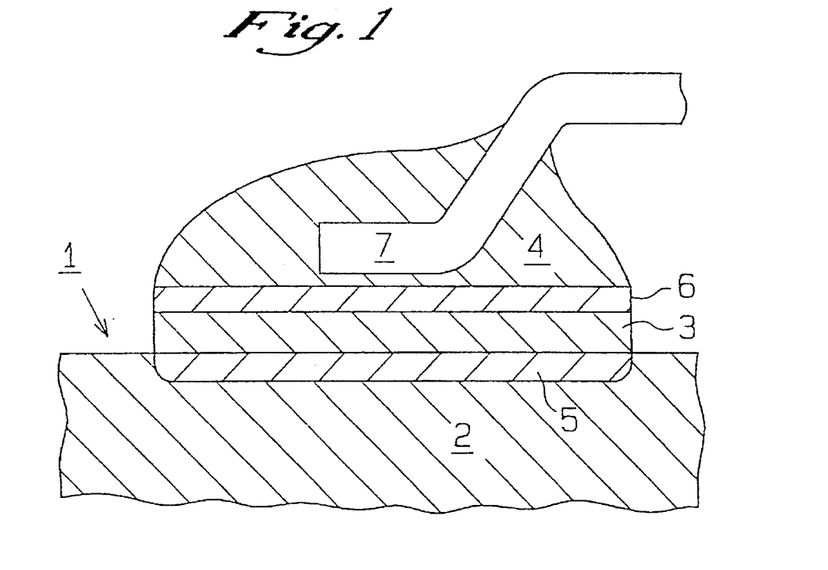
FIG. 1 is an exemplary fragmentary cross section of an IC for explaining a solder-bonded structure according to one embodiment of the present invention.

FIG. 1 presents a cross-sectional view of essential portions which illustrate a hybrid IC 1 according to this embodiment. As shown in FIG. 1, a conductor 3 is provided on an alumina substrate 2. The conductor 3 is formed as follows. First, a patterned screen mask is attached on the substrate 2. Next, screen printing is performed on the substrate 2. Conductor paste is then coated on the substrate 2, forming a circuit pattern. The conductor paste contains a binder, silver and platinum as its main constituent and a small amount of bismuth and copper. The substrate 2 with the paste is sintered, thereby forming the conductor 3 on the substrate 2. The elements of the conductor 3 are included in the paste.

The conductor 3 comprises silver and platinum with the platinum content being approximately 0.8% by weight. The most preferable platinum content is approximately 0.7 to 1.0% by weight. If the platinum content is less than 0.7% by weight, it is not so desirable because that silver atoms tend to diffuse into the solder layer. Additionally, the circuit pattern may be short-circuited during use of the IC due to the migration of silver ions in the conductor 3 caused by the potential difference that occur during use. On the other hand, when the platinum content exceeds 1.0% by weight, it is not so desirable for much the same reason. That is, because of the diffusion of silver atoms during soldering and the migration of the silver ions during use. Further, the production cost of the conductor increases.

When the conductor 3 is formed by sintering the substrate 2 with the circuit pattern formed thereon, a connection layer 5 is formed between the substrate 2 and the conductor 3. The connection layer 5 essentially contains composite aluminum oxide, which has bismuth and copper in the paste incorporated therein.

A solder layer 4 is formed on the conductor 3, and lead wires 7 which constitute a part of the hybrid IC 1 are provided on the solder layer 4. Soldering cream containing the composition of the solder layer 4 is coated at a predetermined position on the conductor 3. The soldering cream consists of silver, tin and a flux. After the lead wire 7 are arranged on the soldering cream, a reflow process is carried out for the thus treated conductor 3 to form a solder layer 4. The solder layer 4 consists of tin and silver (Example 1). By way of example, one appropriate solder composition includes silver and tin contents of 3.5% and 96.5% by weight, respectively. These contents correspond to a composition at an eutectic point of a silver-tin alloy. When the solder layer having such composition is used, it is possible to lower the melting point of the solder and to decrease the heat influence on the ICs during the reflow process. It is also possible to increase a solidifying rate and to promote refining the crystal structure. The preferable silver content is approximately 0.1 to 5.0% by weight. If the silver content is less than 0.1% by weight, it is not so desirable because the diffusion of the silver atoms in the conductor into the solder layer tends to occur. On the other hand, when the silver content exceeds 5.0% by weight, it is not so desirable because the solidifying rate tends to decrease.

A silver-tin alloy layer (intermetallic compound) 6 is formed between the conductor 3 and the solder layer 4 after they have experienced heat hysteresis in the reflow process. The intermetallic compound 6 is provided by diffusion of silver in the conductor 3 and tin in the solder layer 4. It is to be noted that since such diffusion is difficult to occur in this embodiment even when the conductor 3 and solder layer 4 are subjected to various types of heat hysteresis, the intermetallic compound 6 is very thin.

Comparison of this example with conventional solder-bonded structures will now be described. In Comparative Example 1 was used solder which had a composition ratio of 62% by weight of tin, 36% by weight of lead and 2% by weight of silver. In Comparative Example 2 was used solder having a composition ratio of 46% by weight of tin, 46% by weight of lead and 8% by weight of bismuth. In Comparative Example 3, solder had a composition rate of 10% by weight of tin, 88% by weight of lead and 2% by weight of silver. Solder compositions and mechanical properties in Comparative Examples 1 to 3 and Example 1 are shown in Table 1.

Figure 2:
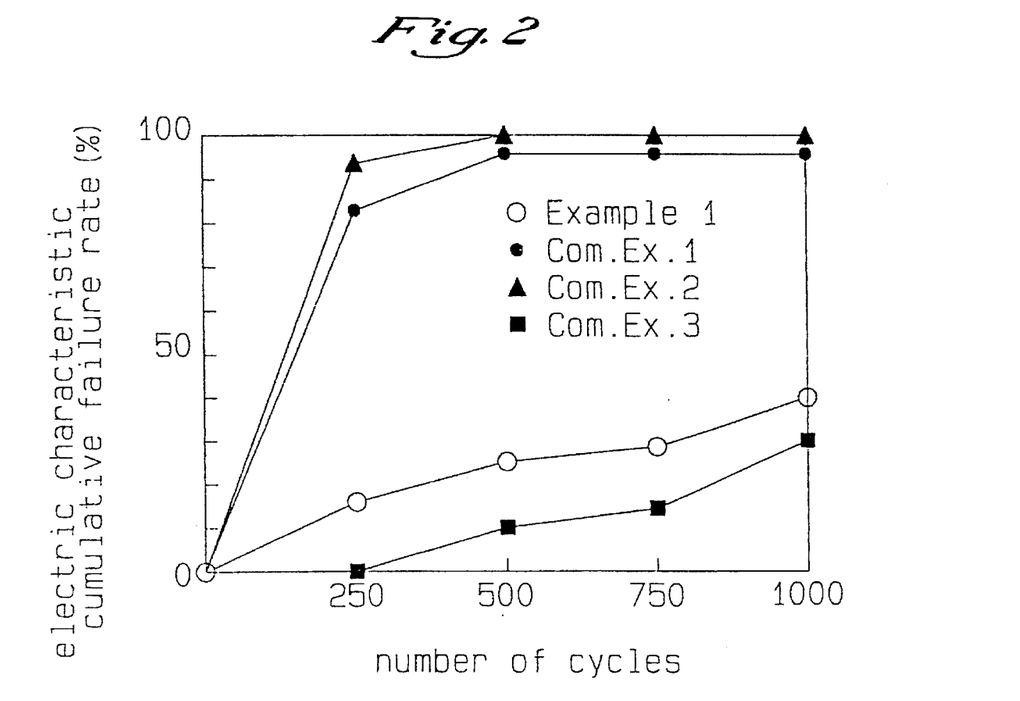
FIG. 2 is a graph showing the relationship between a cumulative failure rate and the number of heat cycles in the embodiment.
Figure 3:
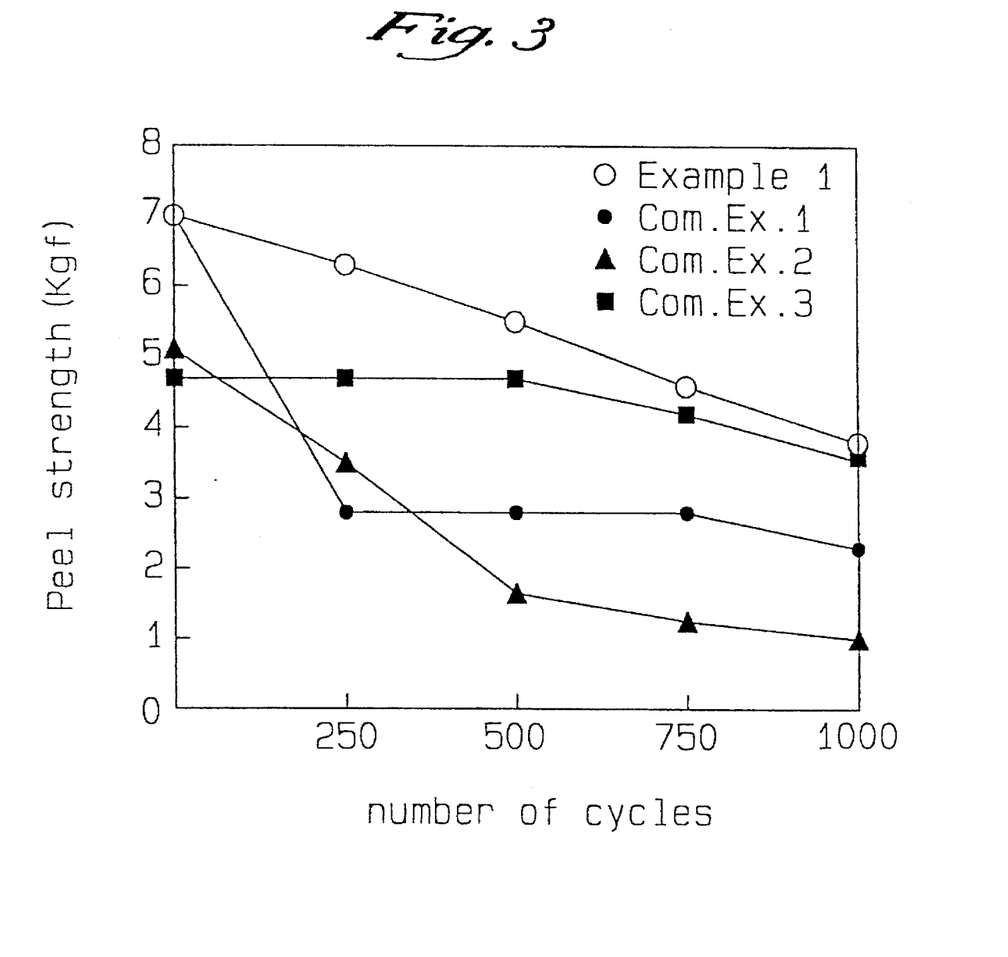
FIG. 3 is a graph showing the relationship between the peel strength of electronic parts and the number of heat cycles in the embodiment.

A heat cycle test was conducted for samples having those four solder-bonded structures to find out the relationship between a electric characteristic cumulative failure rate and the number of heat cycles in the individual case. The failure means increased electric resistance or disconnection between the solder layer and the lead wire. The test results are shown in FIG. 2. FIG. 3 shows the relationship between the peel strength when the electronic parts were peeled from the substrate and the number of heat cycles. One heat cycle in this test was that the solder-bonded structures were each left in a low-temperature air tank at −55° C. for 30 minutes and then in a high-temperature air tank at 150° C. for 30 minutes.

As shown in FIG. 2, the samples of Comparative Examples 1 and 2 have high failure rates at the time of 250 cycles. On the contrary, the samples of Comparative Example 3 and Example 1 had later failure starting and a gentler increase in the failure rate than Comparative Examples 1 and 2. In other words, it is apparent that failures do not easily occur in the samples of Comparative Example 3 and Example 1.

As shown in FIG. 3, the initial peel strengths of the samples of Comparative Examples 2 and 3 are low by 30% compared with those of the samples of Comparative Example 1 and Example 1. Further, the initial peel strength of the sample of Comparative Example 1 is equal to that of the sample of Example 1. After 250 heat cycles, however, the peel strength of the sample of Comparative Example 1 was reduced to 40% of the initial strength, while the sample of Example 1 maintained approximately 90% of the initial peel strength after 250 heat cycles. Even after 1000 cycles, the sample of Example 1 retained 50% of the initial strength or more, and were proved to have excellent durability. It is apparent from the overall results that the sample of Example 1 is the most excellent for practical use.

Figure 4:
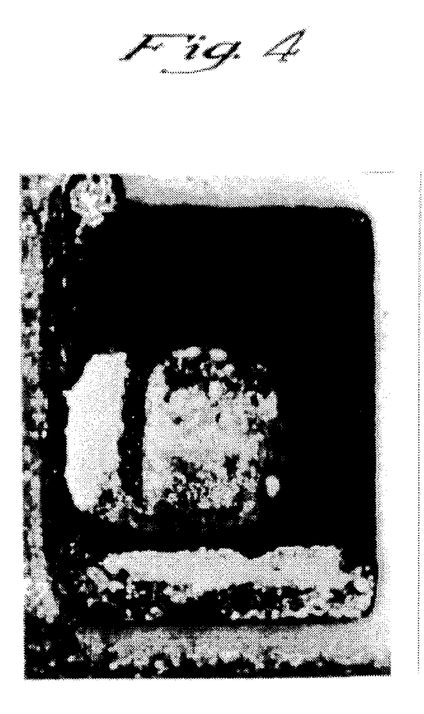
FIG. 4 is a microphotograph of a first peeling mode when peeling is performed in the embodiment.
Figure 5:
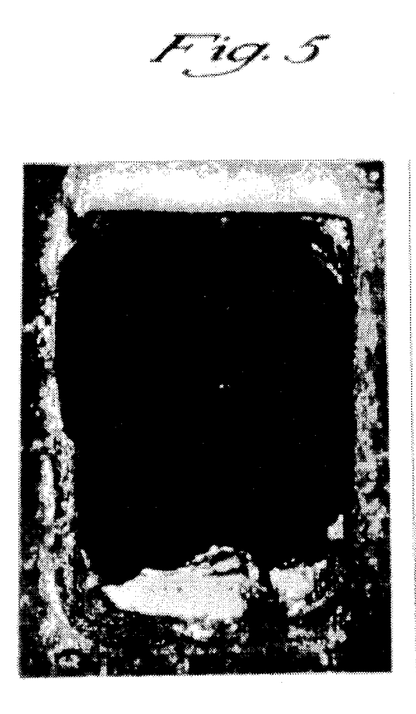
FIG. 5 is a microphotograph of a second peeling mode when peeling is performed in the embodiment.
Figure 6:
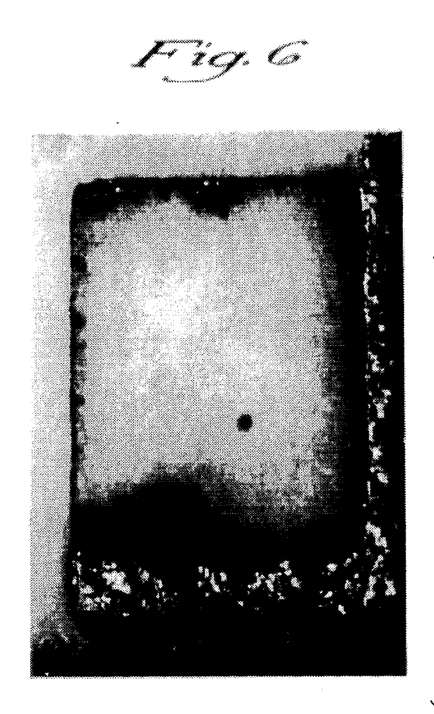
FIG. 6 is a microphotograph of a third peeling mode when peeling is performed in the embodiment.

Next, peeling modes were examined. FIGS. 4 to 6 are microphotographs showing different peeling modes when peeling occurred. The first mode in FIG. 4 shows a breakage at the junction between a lead wire and a solder layer, and the lead having come out from the solder layer. The second mode in FIG. 5 shows that the entire conductor was peeled leaving only a brown film at the position where the conductor had been located. The third mode in FIG. 6 shows peeling with the white base of the substrate appeared.

The samples of Comparative Examples 1 and 2 were peeled in the second or third mode shown in FIG. 5 or 6 in most cases. The samples of Comparative Example 3 and Example 1 were peeled most of times in the first mode shown in FIG. 4. The peeling in the second or third mode in FIG. 5 or 6 means that the connection layer between the conductor and the substrate is deteriorated. That is, it is obvious that in the sample of Example 1 the connection layer between the conductor and the substrate can have less deterioration.

Table 2 shows deterioration of connection layers made of different soldering materials.

As shown in Table 2, in the samples of Comparative Examples 1 and 2, coarseness of crystalline particles in the connection layers, soldering cracks (cracks formed in the solder layers) and substrate cracks (cracks formed in the substrates) occurred at the stages of 250 cycles or 500 cycles. The samples of Comparative Example 3 and Example 1 had later occurrence of coarseness of their crystalline particles, cracks in the solder layers and the substrates. In other words, the sample of Example 1 has excellent durability to heat cycles.

The above deterioration is considered to have occurred because of the following reasons. When tin as a soldering material is diffused in the conductor containing silver as a main component, the silver-tin alloy layer (intermetallic compound) such as $Ag_3Sn$ is formed. The volume is expanded at this time, causing a crack. It is considered that this decreases the bonding strength. In this respect, change in the state of diffusion of metals in the samples of Comparative Example 1 and Example 1 was studied.

Figure 7:
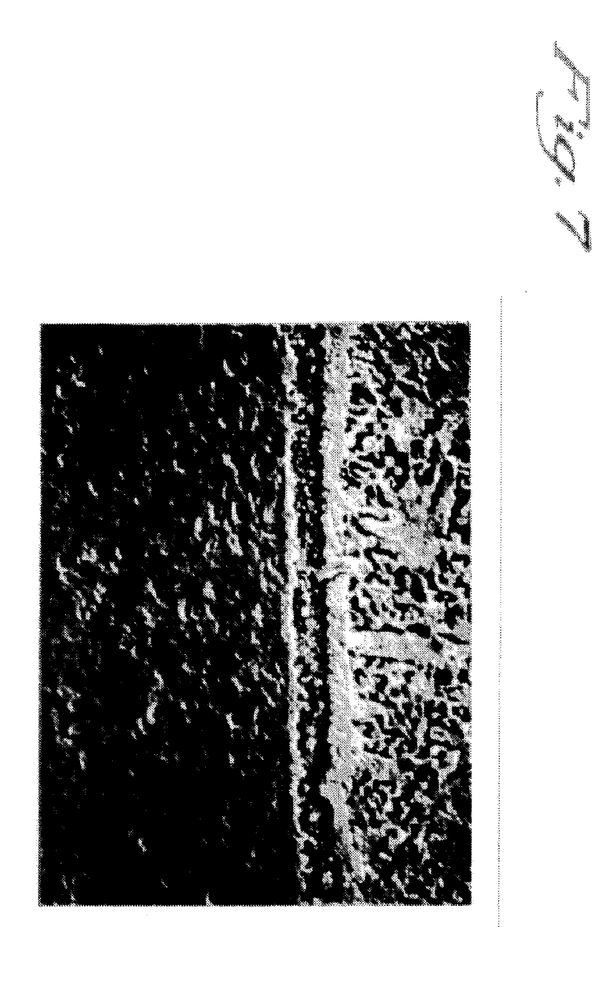
FIG. 7 is a microphotograph showing the initial state of a soldering material in the embodiment.
Figure 8:
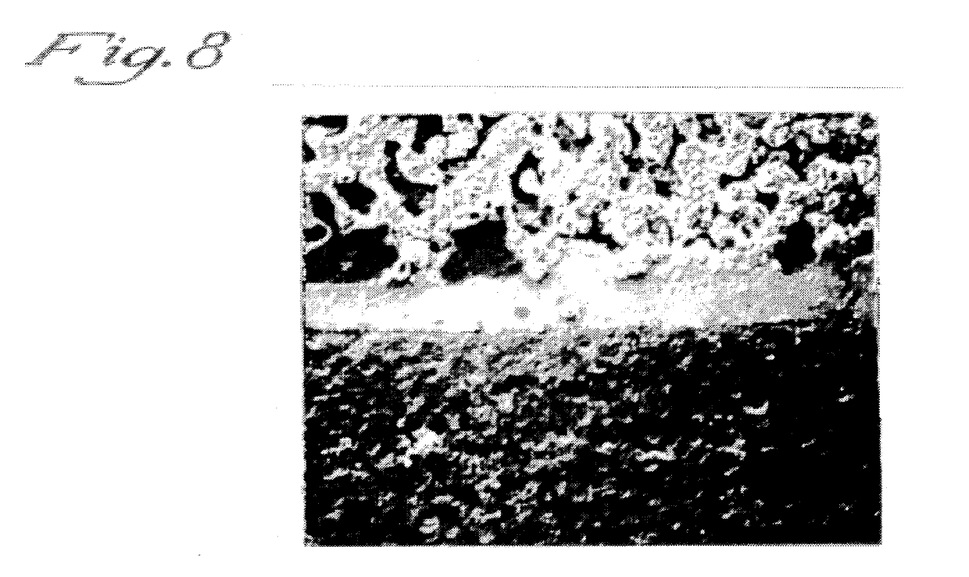
FIG. 8 is a microphotograph showing the state of the soldering material in the embodiment after a heat cycle test is conducted.
Figure 9:
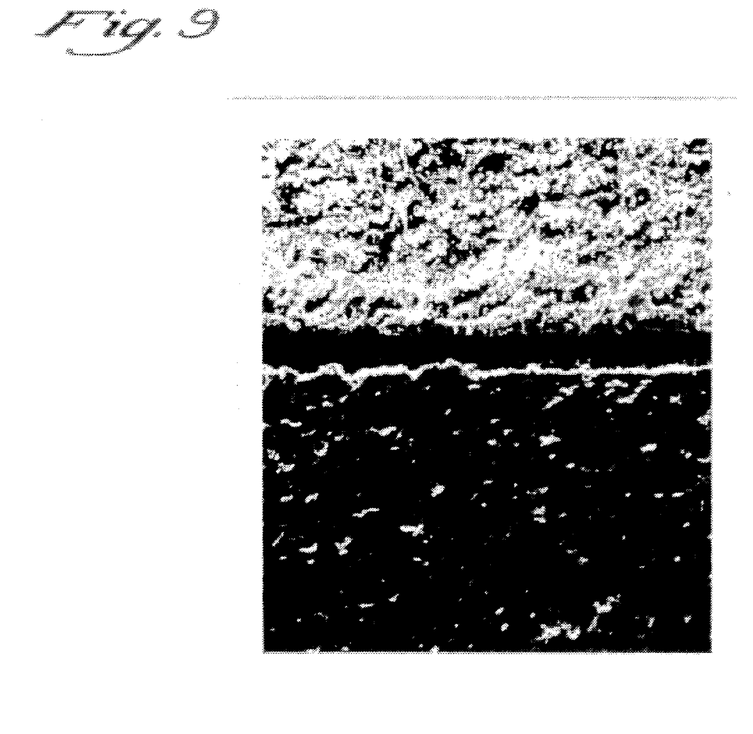
FIG. 9 is a microphotograph showing the initial state of a soldering material in Comparative Example 1.
Figure 10:
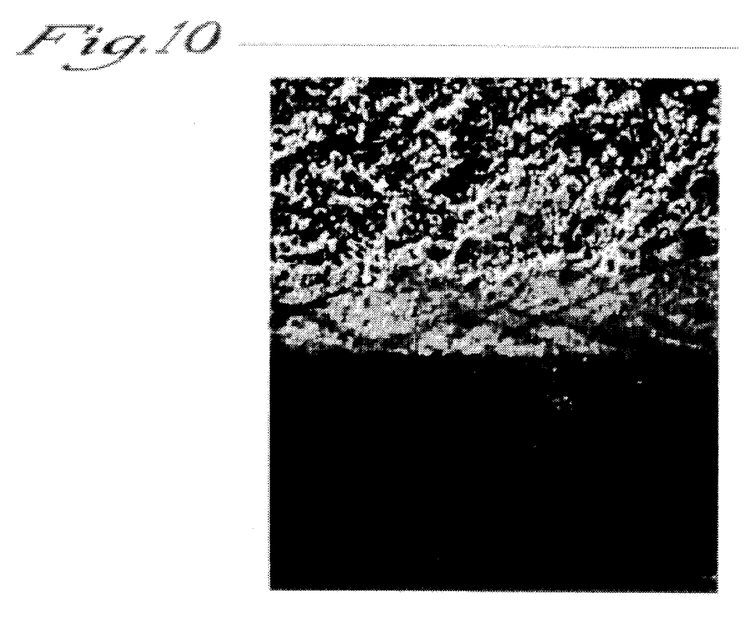
FIG. 10 is a microphotograph showing the state of the soldering material in Comparative Example 1 after a heat cycle test is conducted.

FIGS. 7 and 8 are microphotographs respectively showing the initial state of the sample of Example 1 and the state thereof after 500 heat cycle tests. FIGS. 9 and 10 are microphotographs respectively showing the initial state of the sample of Comparative Example 1 and the state thereof after 500 heat cycle tests. As shown in FIGS. 9 and 10, a silver-tin alloy layer (intermetallic compound) was formed after 500 heat cycle tests were conducted for the sample of Comparative Example 1. In the sample of Example 1, a silver-tin alloy layer (intermetallic compound) had hardly changed from the initial state, as apparent from FIGS. 7 and 8.

the stable silver-tin alloy layer (intermetallic compound) 6 is formed thin between the conductor 3 and the solder layer 4 at the initial stage. Under high temperatures, the silver-tin alloy layer (intermetallic compound) 6 can suppress the metal contained in the solder layer 4 from being diffused into the conductor 3, and prevent further growth of the metallic compound.

As described above in detail, in the hybrid IC 1 (Example 1) according to this embodiment, the conductor 3 on the substrate 2 is made of silver and platinum, and the solder layer 4 is made of only tin and silver. Stronger solder bonding can therefore be realized, and excellent durability to heat cycles can be demonstrated at the bonded junctions.

TABLE 1

| Solder Composition | Fusion Temperature (°C.) | | Tensile Strength (kg/mm$^2$) | Elongation (%) |
|---|---|---|---|---|
| | Liquidus | Solidus | | |
| Comp. Example 1  62Sn36Pb2Ag | 183 | 183 | 5.40 | 30 |
| Comp. Example 2  46Sn46Pb8Bi | 175 | 165 | 4.77 | 48 |
| Comp. Example 3  10Sn88Pb2Ag | 300 | 275 | 4.10 | 45 |
| Example 1  96.5Sn3.5Ag | 221 | 221 | 2.01 | 73 |

TABLE 2

| | Comp. Example 1 | | | Comp. Example 2 | | | Comp. Example 3 | | | Example 1 | | |
|---|---|---|---|---|---|---|---|---|---|---|---|---|
| Number of Cycles | 250 | 500 | 1000 | 250 | 500 | 1000 | 250 | 500 | 1000 | 250 | 500 | 1000 |
| Coarseness of Crystalline Particles | X | X | X | X | X | X | O | O | O | O | O | O |
| Solder Crack | X | X | X | O | X | X | O | O | X | O | O | X |
| Substrate Crack | X | X | X | X | X | X | O | O | X | O | O | X |

X: Occurred
O: None

Further, quantitative analysis was carried out for elements in the conductors of the respective samples before and after the heat cycle test (after 500 cycles were complete). The results are shown in Table 3.

As apparent from Table 3, before the test, the proportion of the elements of each of the conductors in Comparative Examples 1 and 2 was not constant, and differed depending on spots where the samples for elemental analysis were picked up. After the test, however, tin was diffused in the entire conductor in each sample of Comparative Examples 1 and 2, and Ag:Sn was approximately 3:1.

In Comparative Example 3 and Example 1, the proportion of the elements of each conductor both at the initial stage and after the test was almost constant, and Ag:Sn was approximately 3:1. In the sample of Example 1, therefore,

TABLE 3

| | | Sn | Ag | Pb | Pt | Bi |
|---|---|---|---|---|---|---|
| Comparative Example 1 | Initial | 25.6 | 66.2 | 6.1 | 2.1 | — |
| | | 18.3 | 77.1 | 2.8 | 1.8 | — |
| | | 34.3 | 58.7 | 5.5 | 1.5 | — |
| | After test | 22.9 | 72.4 | 3.1 | 1.6 | — |
| Comparative Example 2 | Initial | 18.8 | 45.5 | 29.8 | 1.8 | 4.1 |
| | | 22.6 | 58.9 | 13.3 | 1.7 | 3.5 |
| | | 19.3 | 58.2 | 18.0 | 1.3 | 3.2 |
| | After test | 23.3 | 73.1 | 2.4 | 1.2 | — |
| Comparative Example 3 | Initial | 22.9 | 72.7 | 2.5 | 1.9 | — |
| | After test | 22.1 | 73.1 | 3.2 | 1.6 | — |
| Example 1 | Initial | 25.3 | 72.7 | — | 2.0 | — |

TABLE 3-continued

|  | Sn | Ag | Pb | Pt | Bi |
|---|---|---|---|---|---|
| After test | 24.9 | 78.8 | — | 1.5 | — |

Values in Table 3 indicate at % (atomic percentage).

What is claimed is:

1. A bond for conductively attaching an electronic part to a substrate, the bond comprising:

a conductor comprised of silver formed upon the substrate; and a solder layer consisting of tin and silver, the content of silver in the solder layer being between approximately 0.1 and 5.0 percent by weight, such that the silver of the conductor and the tin of the solder layer form an intermetallic compound which serves as a barrier to solder migration, the intermetallic compound being formed continuously at the boundary of the conductive layer and the solder layer during soldering.

2. The bond for conductively attaching an electronic part to a substrate as recited in claim 1, wherein said conductor further comprises platinum.

3. The bond for conductively attaching an electronic part to a substrate as recited in claim 2, wherein the content of platinum in the conductor is between approximately 0.7 and 1.0 percent by weight.

4. A hybrid IC comprising:

an alumina substrate;

a conductor layer sintered to the substrate such that a connection layer is formed upon the substrate, the conduction layer being formed of silver and platinum, the content of platinum being between approximately 0.7 and 1.0 percent by weight; and a solder layer soldered to the conductor for coupling an electronic part to the conductor, the solder being formed from a tin-silver solder wherein the silver content of the solder is between 0.1 and 5.0 percent, by weight, such that the silver of the conductor and the tin of the solder layer form an intermetallic compound which serves as a barrier to solder migration, the intermetallic compound being formed continuously at the boundary of the conductive layer and the solder layer during soldering.

* * * * *